(12) United States Patent
Anthis et al.

(10) Patent No.: US 10,364,492 B2
(45) Date of Patent: Jul. 30, 2019

(54) FILM DEPOSITION USING PRECURSORS CONTAINING AMIDOIMINE LIGANDS

(71) Applicant: Applied Materials, Inc., Santa Clara, CA (US)

(72) Inventors: Jeffrey W. Anthis, San Jose, CA (US); David Thompson, San Jose, CA (US); Ravi Kanjolia, North Andover, MA (US); Shaun Garrett, Wirral (GB)

(73) Assignee: APPLIED MATERIALS, INC., Santa Clara, CA (US)

( * ) Notice: Subject to any disclaimer, the term of this patent is extended or adjusted under 35 U.S.C. 154(b) by 185 days.

(21) Appl. No.: 14/515,958

(22) Filed: Oct. 16, 2014

(65) Prior Publication Data

US 2015/0118100 A1    Apr. 30, 2015

Related U.S. Application Data

(60) Provisional application No. 61/896,277, filed on Oct. 28, 2013.

(51) Int. Cl.
| | |
|---|---|
| *C23C 16/18* | (2006.01) |
| *C23C 16/455* | (2006.01) |
| *C22C 22/00* | (2006.01) |
| *C23C 16/34* | (2006.01) |

(52) U.S. Cl.
CPC ............. *C23C 16/18* (2013.01); *C22C 22/00* (2013.01); *C23C 16/34* (2013.01); *C23C 16/45553* (2013.01)

(58) Field of Classification Search
CPC ...................................... C23C 16/34
See application file for complete search history.

(56) References Cited

U.S. PATENT DOCUMENTS

| | | | |
|---|---|---|---|
| 2013/0164456 A1* | 6/2013 | Winter | C23C 16/34 427/535 |
| 2013/0251903 A1* | 9/2013 | Han | C23C 16/18 427/252 |

FOREIGN PATENT DOCUMENTS

WO    WO2012067439    *    5/2012

* cited by examiner

*Primary Examiner* — Joseph A Miller, Jr.
(74) *Attorney, Agent, or Firm* — Servilla Whitney LLC

(57) ABSTRACT

Methods are provided for deposition of films comprising manganese on surfaces using metal coordination complexes comprising an amidoimino-based ligand. Certain methods comprise exposing a substrate surface to a manganese precursor, and exposing the substrate surface to a co-reagent.

20 Claims, No Drawings

FILM DEPOSITION USING PRECURSORS CONTAINING AMIDOIMINE LIGANDS

This application claims priority to U.S. Provisional Application No. 61/896,277, filed Oct. 28, 2013.

TECHNICAL FIELD

The present invention relates generally to methods of depositing thin films comprising manganese and to metal coordination complexes useful in such methods. In particular, the invention relates to the use of coordination complexes containing amidoimine-based ligands to deposit manganese-containing films.

BACKGROUND

Deposition of thin films on a substrate surface is a ubiquitous process in a variety of industries including semiconductor processing, diffusion barrier coatings and dielectrics for magnetic read/write heads. In the semiconductor industry, in particular, miniaturization benefits from atomic level control of thin film deposition to produce conformal coatings on high aspect structures. One method for deposition of thin films with atomic layer control and conformal deposition is atomic layer deposition (ALD), which employs sequential, surface reactions to form layers of precise thickness controlled at the Angstrom or monolayer level. Most ALD processes are based on binary reaction sequences which deposit a binary compound film. Each of the two surface reactions occurs sequentially a thin film can be deposited with a relatively high level of control. Because the surface reactions are sequential, the two gas phase reactants are not in contact, and possible gas phase reactions that may form and deposit particles are limited.

ALD has been used to deposit metals and metal compounds on substrate surfaces. $Al_2O_3$ deposition is an example of a typical ALD process illustrating the sequential and self-limiting reactions characteristic of ALD. $Al_2O_3$ ALD conventionally uses trimethylaluminum (TMA, often referred to as reaction "A" or the "A" precursor) and $H_2O$ (often referred to as the "B" reaction or the "B" precursor). In part A of the binary reaction, hydroxyl surface species react with vapor phase TMA to produce surface-bound $AlOAl(CH_3)_2$ and $CH_4$ in the gas phase. This reaction is self-limited by the number of reactive sites on the surface. In part B of the binary reaction, $AlCH_3$ of the surface-bound compound reacts with vapor phase $H_2O$ to produce AlOH bound to the surface and $CH_4$ in the gas phase. This reaction is self-limited by the finite number of available reactive sites on surface-bound $AlOAl(CH_3)_2$. Subsequent cycles of A and B, purging gas phase reaction products and unreacted vapor phase precursors between reactions and between reaction cycles, produces $Al_2O_3$ growth in an essentially linear fashion to obtain a targeted film thickness.

Although a few processes have been developed that are effective for deposition of elemental ruthenium and other late transition metals, in general ALD processes for deposition of pure metal have not been sufficiently successful to be adopted commercially. There is a need for new deposition chemistries that are commercially viable, particularly in the area of elemental metal films. The present invention addresses this problem by providing novel chemistries which are specifically designed and optimized to take advantage of the atomic layer deposition process. Therefore, there is a need for method that produces thin films consisting essentially of manganese. There are known methods of depositing thin manganese metal films via physical deposition methods in back end of the line processes. However, the thin metal films deposited these methods have been shown to migrate to $SiO_2$ interfaces, which forms manganese oxide, which acts as a barrier layer and prevents copper diffusion.

SUMMARY

One aspect of the invention pertains to a method of depositing a metal-containing film. The method comprises exposing a substrate surface to a metal precursor having a structure represented by formula (I):

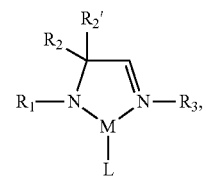

wherein $R_1$, $R_2$, $R_2'$ and $R_3$ are each independently hydrogen, branched or unbranched, C1-C4 alkyl, C1-C4 allyl, or C6-C10 aryl, M is a metal selected from groups 7-10 on the periodic table and copper and L comprises one or more ligands; and exposing the substrate surface to a co-reagent.

Another aspect of the invention also pertains to a method of depositing a metal-containing film. The method comprises exposing a substrate surface to a metal precursor having a structure represented by formula (IA):

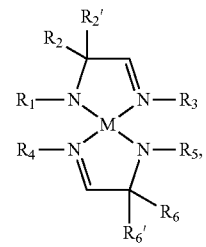

wherein $R_1$, $R_2$, $R_2'$, $R_3$, $R_4$, $R_5$, $R_6$ and $R_6'$ are independently selected from the group consisting of hydrogen, alkyl, and aryl, M is a metal selected from groups 7-10 on the periodic table and copper and L comprises one or more ligands; and exposing the substrate surface to a co-reagent.

Yet another aspect of the invention also method of depositing a manganese-containing film. The method comprises exposing a substrate surface to a manganese precursor having a structure represented by:

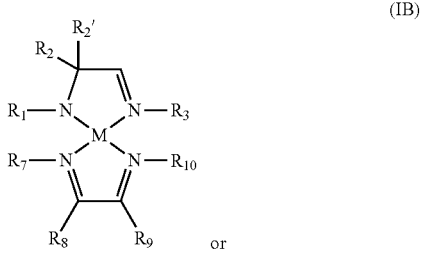

(IB)

or

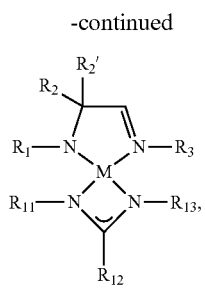

(IC)

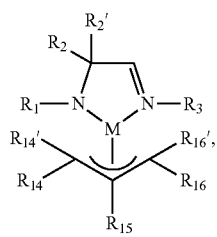

(ID)

wherein $R_1$, $R_2$, $R_2'$, $R_3$, $R_7$, $R_8$, $R_9$, and $R_{10}$ are independently selected from the group consisting of hydrogen, alkyl, and aryl, $R_{11}$, $R_{12}$, and $R_{13}$ are independently selected from the group consisting of hydrogen, alkyl, and aryl, and $R_{14}$, $R_{14}'$, $R_{15}$, $R_{16}$, and $R_{16}'$ are independently selected from the group consisting of hydrogen, alkyl, aryl, and silyl; and exposing the substrate surface to ammonia to produce a film comprising manganese nitride.

DETAILED DESCRIPTION

Before describing several exemplary embodiments of the invention, it is to be understood that the invention is not limited to the details of construction or process set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

Embodiments of the invention relate to the production of metal-containing films. In some embodiments, the films consist essentially of a given metal. As used herein, the phrase "film consisting essentially" of a given metal, is used interchangeably with "elemental" metal and "pure" metal films.

In some embodiments, manganese (Mn) or manganese nitride ($MnN_x$) from an organometallic precursor. The deposition methods can be atomic layer deposition (ALD) or chemical vapor deposition (CVD). The organometallic precursor comprises at least one amidoimine-based ligand. There are few examples of CVD/ALD films of high quality and high purity $MnN_x$ or elemental manganese. Some precursors have oxygen containing ligands, which leads to $MnO_x$ formation. Manganese oxides formed on copper surfaces has difficulty to segregate away and will increase the via resistance. Some precursors have extremely low vapor pressure and reaction rate, which poses challenges for chamber design and poor film morphology during ALD deposition. Advantages of the precursor of one or more embodiments of the invention include generation of a high purity manganese film and manganese nitride films with smooth morphology and conformality, which is beneficial in view of the miniaturization for high aspect structures.

The term "metal coordination complex" as used herein is used interchangeably with "metal complex" and "coordination complex," and includes structures that consist of a central metal atom bonded to one or more ligands. As will be discussed in more detail below, the metal complexes according to one or more embodiments of the invention feature an amidoimine ligand. These coordination complexes act as precursors for films comprising the metal that is the central metal atom of the complex.

A first class of precursors which are useful in such a process contain one or more amidoimino-based ligands. This aspect relates to a metal atom (e.g., a manganese atom) with an amidoimino-based ligands. These amidoimino-based ligands attach to the metal center through two nitrogen atoms. The amido nitrogen is anionic and formally oxidizes the metal center by 1 electron, while the imino fragment is neutral and does not formally oxidize the metal center. While not wishing to be bound to any particular theory, it is thought that this class of ligands will offer the benefits of amido and beta diimines, such as the all nitrogen bonding and metal center stabilization. At the same time the ligands are thought be more labile, due to the weak immine interaction with the metal center.

Accordingly, a first aspect of the invention pertains to a compound having a structure represented by formula (I):

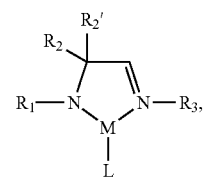

wherein $R_1$, $R_2$, $R_2'$ and $R_3$ are each independently hydrogen, branched or unbranched, C1-C4 alkyl, C1-C4 allyl, or C6-C10 aryl, M is a metal selected from groups 7-10 on the periodic table and copper and L comprises one or more ligands. In one or more embodiments, the metal is selected from manganese, cobalt, nickel and copper. In some embodiments, $R_1$, $R_2$, $R_2'$, and $R_3$ are independently selected from the group consisting of hydrogen, $C_1$-$C_4$-alkyl, and $C_6$-$C_{10}$ aryl. In some embodiments, each of $R_1$, $R_2$, $R_2'$ and $R_3$ is independently methyl, isopropyl or t-butyl. In other embodiments, $R_1$, $R_2$, $R_2'$, and $R_3$ are independently selected from the group consisting of hydrogen, methyl, ethyl, propyl, isopropyl, butyl, sec-butyl, tert-butyl, and phenyl. In some embodiments, $R_2$ and $R_2'$ are each methyl. In one or more embodiments, $R_2$ is not hydrogen and $R_2'$ is hydrogen.

In one or more embodiments, L may represent one, two or three ligands besides the amidoimino-based ligand, which are coordinated via the coordination bond to the metal center. The specific coordination of the ligands will depend on the particular ligands chosen. In some embodiments, L comprises at least one monodentate or bidentate ligand. In further embodiments, L comprises an $\eta^3$-allyl ligand.

In one or more embodiments, L comprises another amidoimino-based ligand (i.e. homoleptic). The R substituents may be exactly the same or they may be different. A homoleptic complex may be represented by a structure having formula (IA):

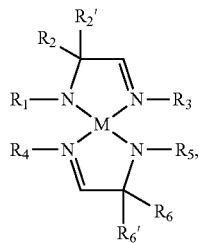

wherein $R_1$, $R_2$, $R_2'$, $R_3$, $R_4$, $R_5$, $R_6$ and $R_6'$ are independently selected from the group consisting of hydrogen, alkyl, and aryl; and M is a metal selected from Groups 7-10 of the periodic table or is copper. In some embodiments, $R_1$, $R_2$, $R_2'$, $R_3$, $R_4$, $R_5$, $R_6$ and $R_6'$ are independently selected from the group consisting of hydrogen, $C_1$-$C_4$-alkyl, and $C_6$-$C_{10}$-aryl. In one or more embodiments, $R_1$, $R_2$, $R_2'$, $R_3$, $R_4$, $R_5$, $R_6$ and $R_6'$ are independently selected from the group consisting of hydrogen, methyl, ethyl, propyl, isopropyl, butyl, sec-butyl, tert-butyl, and phenyl. In some embodiments, $R_2$, $R_2'$, $R_6$, and $R_6'$ are each methyl.

In some embodiments, L comprises a diazabutadiene (DAD), amidinate (amd) or allyl ligand. For example, the precursor may comprise a DAD ligand, and be represented by the structure having formula (IB):

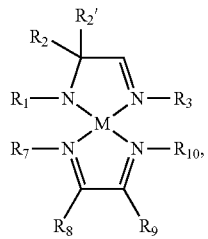

wherein $R_1$, $R_2$, $R_2'$, $R_3$ and M are defined as described above, $R_7$, $R_8$, $R_9$, and $R_{10}$ are independently selected from the group consisting of hydrogen, alkyl, and aryl. In one or more embodiments, $R_1$, $R_2$, $R_2'$, $R_3$, $R_7$, $R_8$, $R_9$, and $R_{10}$ are independently selected from the group consisting of hydrogen, $C_1$-$C_4$-alkyl, and $C_6$-$C_{10}$-aryl. In some embodiments, $R_1$, $R_2$, $R_2'$, $R_3$, $R_7$, $R_8$, $R_9$, and $R_{10}$ are independently selected from the group consisting of hydrogen, methyl, ethyl, propyl, isopropyl, butyl, sec-butyl, tert-butyl, and phenyl. In further embodiments, $R_7$, $R_8$, $R_9$, and $R_{10}$ comprise methyl, ethyl, n-propyl, i-propyl, n-butyl, i-butyl, t-butyl or cyclohexyl groups. In even further embodiments, $R_2$ and $R_2'$ are each methyl. In one or more embodiments, wherein $R_8$ and $R_9$ are each hydrogen. In some embodiments, R7 and R10 are each alkyl. In some such embodiments, the alkyl group is a C1-C4 alkyl group.

As used herein, reference to a ligand may include derivatives. That is, in some embodiments, the compound comprises one amidoimino ligand and one amidinate ligand. Where the metal comprises manganese, it may be represented by the structure having formula (IC):

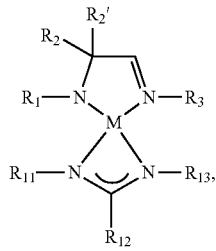

wherein $R_1$, $R_2$, $R_2'$, $R_3$ and M are defined as described above, $R_{11}$, $R_{12}$, and $R_{13}$ are independently selected from the group consisting of hydrogen, alkyl, and aryl. In some embodiments, $R_1$, $R_2$, $R_2'$, $R_3$, $R_{11}$, $R_{12}$, and $R_{13}$ are independently selected from the group consisting of hydrogen, $C_1$-$C_4$-alkyl and $C_6$-$C_{10}$-aryl. In one or more embodiments, $R_1$, $R_2$, $R_2'$, $R_3$, $R_{11}$, $R_{12}$, and $R_{13}$ are independently selected from the group consisting of hydrogen, methyl, ethyl, propyl, isopropyl, butyl, sec-butyl, tert-butyl, and phenyl. In some embodiments, $R_2$ and $R_2'$ are each methyl. In further embodiments, $R_{11}$, $R_{12}$, and $R_{13}$ comprise methyl, ethyl, n-propyl, i-propyl, n-butyl, i-butyl, t-butyl or cyclohexyl groups.

In one or more embodiments, L comprises an allyl ligand, and may be represented by a structure having formula (ID):

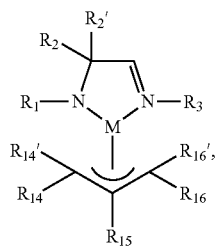

wherein $R_1$, $R_2$, $R_2'$, $R_3$ and M are defined as described above, $R_{14}$, $R_{14}'$, $R_{15}$, $R_{16}$, and $R_{16}'$ are independently selected from the group consisting of hydrogen, alkyl, aryl, and silyl. In some embodiments, $R_1$, $R_2$, $R_2'$, and $R_3$ are independently selected from the group consisting of hydrogen, $C_1$-$C_4$-alkyl, $C_6$-$C_{10}$-aryl; and $R_{14}$, $R_{14}'$, $R_{15}$, $R_{16}$, and $R_{16}'$ are independently selected from the group consisting of hydrogen, $C_1$-$C_4$-alkyl, $C_6$-$C_{10}$-aryl, and tri($C_1$-$C_4$-alkyl) silyl. In one or more embodiments, $R_1$, $R_2$, $R_2'$, and $R_3$ are independently selected from the group consisting of hydrogen, methyl, ethyl, propyl, isopropyl, butyl, sec-butyl, tert-butyl, and phenyl; and $R_{14}$, $R_{14}'$, $R_{15}$, $R_{16}$, and $R_{16}'$ are independently selected from the group consisting of hydrogen, methyl, ethyl, propyl, isopropyl, butyl, sec-butyl, tert-butyl, phenyl, and trimethylsilyl. In some embodiments, $R_2$ and $R_2'$ are each methyl.

Any of the complexes described above may be in the form of a solvate. The solvate may be an ether solvate, an amine solvate or an aromatic hydrocarbon solvate.

Synthesis of the amidoimine ligands may be carried out by reacting $Br_2$ and 1,4-dioxane to result in $Br_2$.1,4-dioxane. $Br_2$.1,4-dioxane may then be reacted with isobutyraldehyde, which results in a brominated isobutyraldehyde. This halogenated compound can then be reacted with tetrahydrofuran (THF) and an alkyl amine having the alkyl chain targeted in the final ligand. For example, t-butylamine and i-propylamine can be used to achieve t-butyl (shown as ligand A below)

or i-propyl branching. These can be further reacted to obtain other branching as well. For example, the brominated isobutyraldehyde may be reacted with i-propylamine and THF, followed by additional reaction with t-butylamine and THG to result in a ligand with both i-propyl and t-butyl branching (shown as ligand B below). These processes are shown in Synthetic Scheme 1 below.

Synthetic Scheme 1:

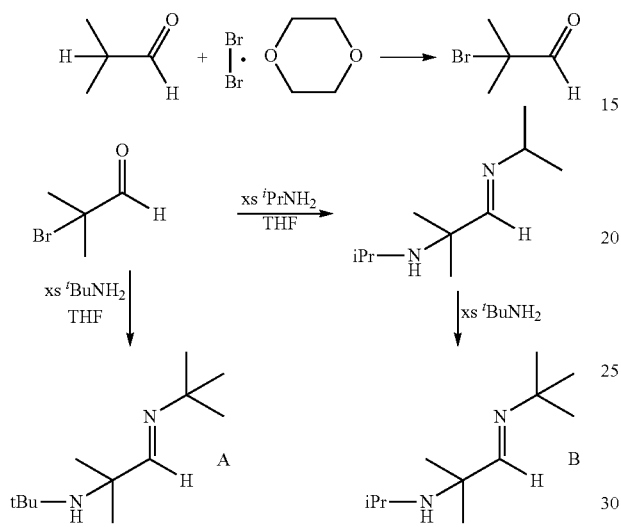

One or more compounds as described herein may be synthesized by starting with a protonated ligand. The lithium or sodium salt of the ligand may then be prepared by deprotonating with nBuLi or NaH. The ligand salt may then be reacted with a metal halide containing the targeted metal (copper or a metal selected from Groups 7-10 in the periodic table). In embodiments relating to the DAD ligand, the free ligand may be reacted with sodium metal to produce the sodium salt, which then may be reacted with the metal halide. In some embodiments, alkyl lithiums may not cleanly deprotonate at the amine group, and/or form a mix of products. Thus, in some embodiments, $Mn(N(SiMe_3)_2)_2$ may be used as a reactant.

In one or more embodiments, the complexes utilized contain a ligand based off of ligand A shown above. While not wishing to be bound to any particular theory, it is thought that it is beneficial to have a $CMe_2$ group between amine and imine functionalities because of ease of synthesis and for ensuring that the resulting Mn complex is stable. It is thought that in the case of embodiments pertaining to Mn complexes, Mn amide complexes are particularly unstable to β-hydride elimination. For this reason, tertiary-substituted carbons α to N are best to achieve stable complexes. For this reason it would be expected that ligand B might be less useful than ligand A.

Examples of the precursors and methods of synthesis follow below. Homoleptic bis(amidoimine)manganese, which has a structure represented by formula IA:

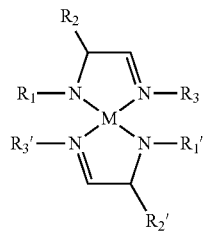

IA may be prepared by first adding amidoimine ligand (2 equiv) by transfer cannula to a solution of Bis(trimethylsilylamido) manganese (1 equiv) in toluene. The resulting mixture is refluxed for 24 hours. The solvent and hexamethyldisilazane by-product are then removed under reduced pressure. The resulting product is then distilled at ca. 120° C./0.5 Torr.

Heteroleptic bis(amidoimine)manganese may be prepared by first adding amidoimine ligand A (1 equiv) by transfer cannula to solution of Bis(trimethylsilylamido)manganese (1 equiv) in toluene. The solvent and hexamethyldisilazane by-product are then removed under reduced pressure. The resulting product is then dissolved in toluene and treated with amidoimine ligand B (1 equiv), refluxing for a further 24 hours. The solvent and hexamethyldisilazane by-product are then removed under reduced pressure and the product distilled at ca. 120° C./0.5 Torr.

An (amidoimine)(amidinato)manganese complex, which has a structure represented by formula IB:

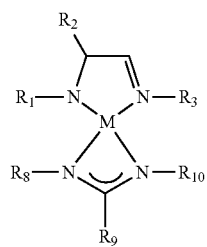

IB may be prepared by first adding amidoimine ligand (1 equiv) by transfer cannula to a solution of Bis(trimethylsilylamido) manganese (1 equiv) in toluene. The resulting mixture is refluxed for 24 hours. The solvent and hexamethyldisilazane by-product are then removed under reduced pressure. The resulting product is then dissolved in toluene and treated with $R_8N=C(R_9)NHR_{10}$ (1 equiv), refluxing for a further 24 hours. The solvent and hexamethyldisilazane by-product are then removed under reduced pressure and the product distilled at ca. 120° C./0.5 Torr.

An (amidoimine)(diazadiene)manganese complex, which has a structure represented by formula IC:

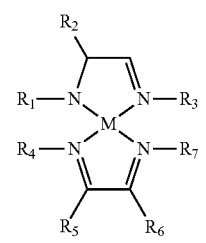

IC may be prepared by first adding amidoimine ligand (1 equiv) by transfer cannula to a solution of Bis(trimethylsilylamido)manganese (1 equiv) in toluene. The resulting mixture is refluxed for 24 hours. The solvent and hexamethyldisilazane by-product are then removed under reduced pressure. Under argon, the product is dissolved in THF (100 ml) and a solution of Li[$R_4$NC($R_5$)C($R_6$)N($R_7$)] (prepared from $R_4$N=C($R_5$)C($R_6$)=N($R_7$) and freshly cut Li metal in THF) in THF (100 ml) is added. The mixture is stirred at room temperature overnight. The solvent and lithium hexamethyldisilazide by-product are then removed under reduced pressure up to 90° C./0.5 Torr and then the product distilled at ca. 120° C./0.5 Torr.

An (amidoimine)(allyl)manganese complex, which has a structure represented by formula ID:

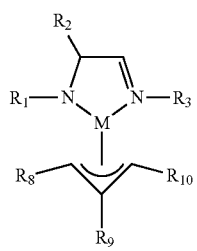

(ID)

may be prepared by first adding 2 equiv of K[$R_8$CHC($R_9$)CHR$_{10}$] or [$R_8$CHC($R_9$)CHR$_{10}$]MgX (X=Cl, Br, I) in THF or diethyl ether to a suspension of Manganese chloride (1 equiv) in THF at −78° C. The mixture is stirred for several hours, until the solid dissolves and color change is observed. 1 equiv of amidoimine ligand is then added by syringe and the mixture allowed to warm to room temperature slowly. The solvent is then removed under reduced pressure and the residue extracted into hexane. The mixture is then filtered by cannula and then the solvent removed under reduced pressure. The product is then distilled/sublimed as appropriate.

As described above, these metal coordination complexes are useful in the production of thin metal films. Accordingly, another aspect of the invention pertains to a method of depositing a metal-containing film, the method comprising exposing a substrate surface to a metal precursor having a structure represented by:

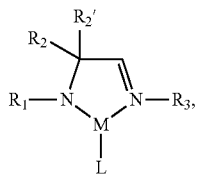

wherein $R_1$, $R_2$, $R_2'$ and $R_3$ are each independently hydrogen, branched or unbranched, C1-C4 alkyl, C1-C4 allyl, or C6-C10 aryl, M is a metal selected from groups 7-10 on the periodic table and copper and L comprises one or more ligands; and exposing the substrate surface to a co-reagent. In one or more embodiments, the metal is selected from manganese, cobalt, nickel and copper.

One or more of the methods described above may be an atomic layer deposition (ALD) process. In such embodiments, the substrate surface is exposed to the metal precursor and co-reagent sequentially or substantially sequentially. As used herein throughout the specification, "substantially sequentially" means that a majority of the duration of the precursor exposure does not overlap with the exposure to the co-reagent, although there may be some overlap.

Any of the above-referenced compounds may be used in these deposition methods. For example, in some embodiments, the metal precursor has a structure represented by:

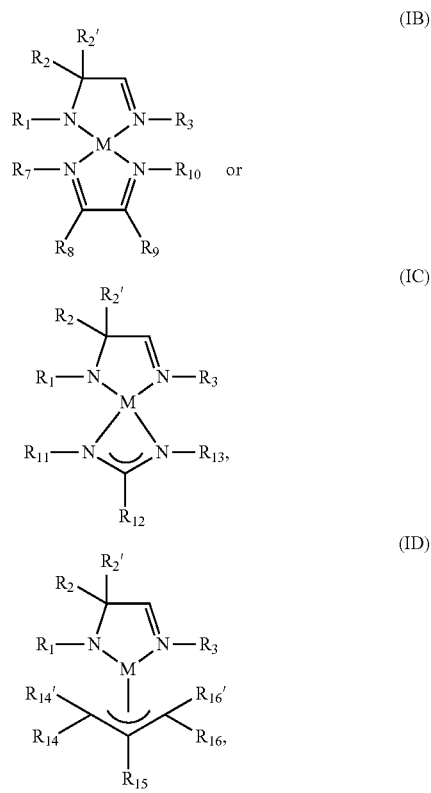

wherein $R_1$, $R_2$, $R_2'$, $R_3$, $R_7$, $R_8$, $R_9$, and $R_{10}$ are independently selected from the group consisting of hydrogen, alkyl, and aryl, $R_{11}$, $R_{12}$, and $R_{13}$ are independently selected from the group consisting of hydrogen, alkyl, and aryl, and $R_{14}$, $R_{14}'$, $R_{15}$, $R_{16}$, and $R_{16}'$ are independently selected from the group consisting of hydrogen, alkyl, aryl, and silyl.

One or more of the methods described above may be a chemical vapor deposition (CVD) process. In such embodiments, the substrate surface is exposed to the metal precursor and co-reagent simultaneously or substantially simultaneously. As used herein throughout the specification, "substantially simultaneously" means that the majority of the duration of the precursor exposure overlaps with the exposure to the co-reagent, although they may not be exactly co-extensive.

Selection of the co-reagent will determine what film is obtained. In some embodiments, the co-reagent comprises a reducing agent. In such embodiments, a film consisting essentially of the metal is obtained. In further embodiments, the resulting film consisting essentially of manganese contains more than about 80, 85, 90, 95 or 98% metal. Examples of suitable reducing agents include, but are not limited to, hydrogen gas.

In other embodiments, the co-reagent may comprise ammonia or an amine. In such embodiments, the manganese film comprises a metal nitride. In embodiments where the metal is manganese, a manganese nitride film is obtained, also referred to as "$MnN_x$." The x of some embodiments is in the range of about 0.1, 0.2, 0.25 to about 1, 2, 3 or 4, or in the range of about 0.2 to about 2, or in the range of about 0.25 to about 1.

The deposited manganese or $MnN_x$ film can be used as an alternative diffusion barrier in the back-end-of-line copper interconnections to replace currently used PVD TaN or ALD TaN. Tantalum nitride (TaN) is a copper barrier at film thicknesses greater than 10 A, where the film is continuous. However, because a Ta atom is about 4 A in diameter, TaN films around 5 A thick are not continuous. For smaller nodes with thinner TaN, TaN by itself may be a discontinuous film, thus limiting copper barrier properties. Current methods include a Ta layer over a TaN layer, which acts as a wetting layer for copper and provides the continuity of a barrier film. For smaller nodes (less than 32 nm), however, this method leads to larger line resistance and hence is not an adequate solution. Atomic layer deposition (ALD) TaN is being used as an advanced technology with better conformality; however, the film quality of ALD TaN still needs significant improvements. MnN may be a suitable replacement for TaN, and thus new methods for deposition of MnN are sought.

The deposition approaches described herein can be integrated with the ALD TaN deposition to generate manganese doped TaN or tantalum doped with $MnN_x$. Manganese or $MnN_x$ are new materials being proposed for these applications. Manganese can react with dielectric underlayers to form manganese silicates as the barrier. Without being bound to any particular theory of operation, it is believed that the $MnN_x$ is not only the diffusion barrier but also promotes the adhesion between copper and the dielectrics. Therefore, in some embodiments, the methods further comprise depositing copper over the manganese-containing film.

The precursors and/or reactants may be in a state of gas, plasma, vapor or other state of matter useful for a vapor deposition process. The methods optionally feature a purge. During a purging process, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between pulses of precursor and co-reactants.

In another embodiment, a method of forming a metal film on a substrate surface comprises: during an atomic layer deposition process, exposing a substrate to a vapor phase metal coordination complex according to one or more of the embodiments described above, such that a layer is formed on the surface comprising the metal coordination complex bound to the surface by the metal center (i.e., manganese); during an atomic layer deposition process, exposing the substrate having bound metal complex with a co-reagent such that an exchange reaction occurs between the bound metal coordination complex and co-reagent, resulting in dissociation of the bound metal complex and producing a first layer of elemental metal on the surface of the substrate; and sequentially repeating the atomic layer deposition process and the treatment.

The reaction time, temperature and pressure are selected to create a metal-surface interaction and achieve a layer on the surface of the substrate. The reaction conditions for the ALD reaction will be selected based on the properties of the metal coordination complex. The deposition can be carried out at atmospheric pressure but is more commonly carried out at a reduced pressure. The vapor pressure of the metal coordination complex should be low enough to be practical in such applications. The substrate temperature should be high enough to keep the bonds between the metal atoms at the surface intact and to prevent thermal decomposition of gaseous reactants. However, the substrate temperature should also be high enough to keep the source materials (i.e., the reactants) in the gaseous phase and to provide sufficient activation energy for the surface reaction. The appropriate temperature depends on the specific metal coordination complex used and the pressure. The properties of a specific metal coordination complex for use in the ALD deposition methods of the invention can be evaluated using methods known in the art, allowing selection of appropriate temperature and pressure for the reaction. In general, lower molecular weight and the presence of functional groups that increase the rotational entropy of the ligand sphere result in a melting point that yields liquids at typical delivery temperatures and increased vapor pressure.

An optimized metal coordination complex for use in the deposition methods of the invention will have sufficient vapor pressure, sufficient thermal stability at the selected substrate temperature and sufficient reactivity to produce a reaction on the surface of the substrate without unwanted impurities in the thin film. Sufficient vapor pressure ensures that molecules of the source compound are present at the substrate surface in sufficient concentration to enable a complete self-saturating reaction. Sufficient thermal stability ensures that the source compound will not be subject to the thermal decomposition which produces impurities in the thin film.

In one or more of the methods described herein, additional repetitions of the deposition cycle may be used to build a layer of elemental metal of the targeted thickness. That is, optionally, a second atomic layer of elemental metal may be formed added on the first atomic layer by repeating the process of the reaction cycle. Co-reagent remaining from the preceding reduction reaction is purged from the deposition chamber using an inert gas and a metal coordination complex in vapor phase is again flowed into the chamber into contact with the metal film on the substrate surface. An exchange reaction occurs between the metal coordination complex in the vapor phase and co-reagent on the metal of the first atomic layer. This exchange reaction displaces one of the ligands from the vapor phase metal coordination complex and leaves the metal atom of the metal coordination complex bound to the metal atom of the first atomic layer. The reaction time, temperature and pressure are selected to create a metal-surface interaction and form a layer on the surface of the substrate. Unreacted vapor phase metal coordination complex and released ligand are purged from the deposition chamber using an insert gas. A co-reagent is flowed into the deposition chamber to break the bond(s) between the metal and any remaining ligand(s), releasing the remaining ligand(s) from the metal center and producing a second atomic layer of elemental metal on the first atomic layer of manganese-containing film.

In one embodiment, a second layer of manganese may be added by contacting the first layer of elemental manganese on the substrate surface with a vapor phrase metal coordination complex such that an exchange reaction occurs between the metal complex and the first layer of elemental metal, resulting in the partial dissociation the metal complex and producing a second layer on the surface comprising the partially dissociated metal complex bound to the first elemental manganese layer by manganese; and contacting the bound metal complex of the second layer with a co-reagent such that an exchange reaction occurs between the bound metal complex and the reducing gas, resulting in the dissociation the bound metal complex and producing a second layer of manganese-containing film on the surface of the substrate.

As embodiments of the invention provide a method for depositing or forming manganese-containing films, a processing chamber is configured to expose the substrate to a sequence of gases and/or plasmas during the vapor deposition process. The processing chamber would include separate supplies of reactants, along with any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a deposition process as described herein. The central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be used in all embodiments.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to a separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The exact arrangement and combination of chambers may be altered for purposes of performing specific parts of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet phases. For example, a substrate may be rotated throughout the entire process, or the substrate can be rotated by a small amount between exposure to different reactive or purge gases. Rotating the substrate during processing (either continuously or in phases) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and equivalents.

PROPHETIC EXAMPLES

Example 1—Synthesis of Homeleptic Bis(Amidoimine)Manganese

To a solution of bis(trimethylsilylamido)manganese (10 g, 0.0266 mol) in toluene (200 ml) is added $^t$BuNHCMe$_2$CH=N$^t$Bu (10.6 g, 0.053 mol) by transfer cannula. The resulting mixture is refluxed for 24 hours. The solvent and hexamethyldisilazane by-product are then removed under reduced pressure. The resulting product is then distilled at ca. 120° C./0.5 Torr.

Example 2—Synthesis of Heteroleptic Bis(Amidoimine)Manganese

To a solution of Bis(trimethylsilylamido)manganese (10 g, 0.0266 mol) in toluene (200 ml) is added $^t$BuNHCMe$_2$CH=N$^t$Bu (5.3 g, 0.0266 mol) by transfer cannula The resulting mixture is refluxed for 24 hours. The solvent and hexamethyldisilazane by-product are then removed under reduced pressure. The resulting product is then dissolved in toluene and treated with $^i$PrNHCMe$_2$CH=N$^t$Bu (4.9 g, 0.0266 mol)), refluxing for a further 24 hours. The solvent and hexamethyldisilazane by-product are then removed under reduced pressure and the product distilled at ca. 120° C./0.5 Torr.

Example 3—Synthesis of (Amidoimine)(Amidinato)Manganese

To a solution of Bis(trimethylsilylamido)manganese (10 g, 0.0266 mol) in toluene (200 ml) is added $^t$BuNHCMe$_2$CH=N$^t$Bu ligand (5.3 g, 0.0266 mol) by transfer cannula. The resulting mixture is refluxed for 24 hours. The solvent and hexamethyldisilazane by-product are then removed under reduced pressure. The resulting product is then dissolved in toluene and treated with $^i$PrN=C(Me)NH$^i$Pr (3.8 g, 0.027 mol), refluxing for a further 24 hours. The solvent and hexamethyldisilazane by-product are then removed under reduced pressure and the product distilled at ca. 120° C./0.5 Torr.

Example 4—Synthesis of (Amidoimine)(Diazadiene)Manganese

To a solution of Bis(trimethylsilylamido)manganese (10 g, 0.0266 mol) in toluene is added $^t$BuNHCMe$_2$CH=N$^t$Bu ligand (5.3 g, 0.0266 mol) by transfer cannula. The resulting mixture is refluxed for 24 hours. The solvent and hexamethyldisilazane by-product are then removed under reduced pressure. Under argon, the product is dissolved in THF (100 ml) and a solution of Li[$^t$BuNCHCHN$^t$Bu] (4.7 g, 0.027 mol; prepared from $^t$BuN=CHCH=N$^t$Bu and freshly cut Li metal in THF) in THF (100 ml) is added. The mixture is stirred at room temperature overnight. The solvent and lithium hexamethyldisilazide by-product are then removed under reduced pressure up to 90° C./0.5 Torr and then the product distilled at ca. 120° C./0.5 Torr.

Example 5—Manganese Metal Film

Manganese films are deposited using a manganese precursor containing an amidoimine ligand. The manganese precursor has a structure represented by:

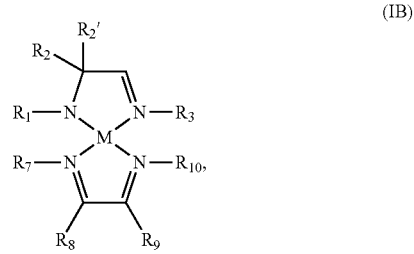

(IB)

wherein each R group is methyl, for example.

First, a substrate surface may be placed in an atomic layer deposition chamber. The substrate surface is then contacted with the manganese precursor. Excess, unreacted precursor is then purged from the reaction chamber. Then, a reducing agent, for hydrogen gas, is flowed into the chamber to the substrate surface. The precursors, which is bound to the substrate surface through the metal center, undergoes reduction, leaving a manganese. The film consists essentially of manganese metal. Excess precursor is then purged from the chamber. The process can be repeated until a film of targeted thickness is achieved.

Example 6—Manganese Nitride Film

Manganese films are deposited using a manganese precursor containing an amidoimine ligand. The manganese precursor has a structure represented by:

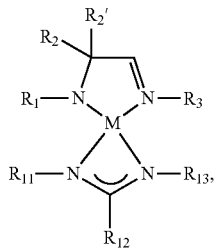

wherein each R group is methyl, for example.

First, a substrate surface may be placed in an atomic layer deposition chamber. The substrate surface is then contacted with the manganese precursor. Excess, unreacted precursor is then purged from the reaction chamber. Then, ammonia gas is flowed into the chamber to the substrate surface. The precursor, which is bound to the substrate surface through the metal center, reacts with the ammonia gas, leaving a film comprising manganese nitride. Excess precursor is then purged from the chamber. The process can be repeated until a film of targeted thickness is achieved.

What is claimed is:

1. A method of depositing a metal-containing film, the method comprising
exposing a substrate surface to a metal precursor having a structure represented by formula (I):

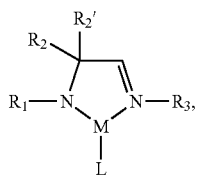

wherein $R_1$, $R_2'$ and $R_3$ are each independently branched or unbranched, C1-C4 alkyl, C1-C4 allyl, or C6-C10 aryl, $R_2$ is hydrogen, branched or unbranched, C1-C4 alkyl, C1-C4 allyl, or C6-C10 aryl, M is a metal selected from groups 7-10 on the periodic table and copper and L comprises one or more ligands; and
exposing the substrate surface to a co-reagent.

2. The method of claim 1, wherein $R_2$ is hydrogen.

3. The method of claim 1, wherein $R_2$ is hydrogen and each of $R_1$, $R_2'$ and $R_3$ is independently methyl, isopropyl or t-butyl.

4. The method of claim 1, wherein the metal precursor is homoleptic.

5. The method of claim 1, wherein L comprises a DAD, amd or allyl ligand.

6. The method of claim 1, wherein the metal comprises manganese, cobalt, nickel or copper.

7. The method of claim 1, wherein the substrate surface is exposed to the co-reagent and the metal precursor simultaneously or substantially simultaneously.

8. The method of claim 1, wherein the co-reagent comprises a reductant, and a film consisting essentially of the metal is produced.

9. The method of claim 1, wherein the co-reagent comprises ammonia or an amine, and a film comprising a metal nitride is produced.

10. A method of depositing a metal-containing film, the method comprising
exposing a substrate surface to a metal precursor having a structure represented by formula (IA):

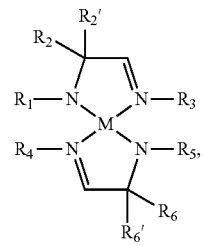

wherein $R_1$, $R_2'$, $R_3$, $R_4$, $R_5$, and $R_6'$ are independently selected from the group consisting of branched or unbranched, C1-C4 alkyl, C1-C4 allyl, or C6-C10 aryl, $R_2$ and $R_6$ are independently selected from the group consisting of hydrogen, branched or unbranched, C1-C4 alkyl, C1-C4 allyl, or C6-C10 aryl, M is a metal selected from groups 7-10 on the periodic table and copper and L comprises one or more ligands; and
exposing the substrate surface to a co-reagent.

11. The method of claim 10, wherein $R_2$ and/or $R_6$ are hydrogen.

12. The method of claim 10, wherein $R_2$ is hydrogen and each of $R_1$, $R_2'$ and $R_3$ is independently methyl, isopropyl or t-butyl.

13. The method of claim 10, wherein the metal comprises manganese, cobalt, nickel or copper.

14. The method of claim 10, wherein the substrate surface is exposed to the co-reagent and the metal precursor simultaneously or substantially simultaneously.

15. The method of claim 10, wherein the substrate surface is exposed to the co-reagent and the metal precursor sequentially or substantially sequentially.

16. The method of claim 10, wherein the co-reagent comprises a reductant, and a film consisting essentially of the metal is produced.

17. The method of claim 10, wherein the co-reagent comprises ammonia or an amine, and a film comprising a metal nitride is produced.

18. The method of claim 1, wherein $R_1$ and $R_3$ are t-butyl, and $R_2$ and $R_2'$ are methyl.

19. The method of claim 18, wherein the metal precursor is homoleptic.

20. The method of claim 10, wherein $R_1$, $R_3$, $R_4$, and $R_5$ are t-butyl, and $R_2$, $R_2'$, $R_6$ and $R_6'$ are methyl.

* * * * *